United States Patent

Wang et al.

[11] Patent Number: 5,548,551
[45] Date of Patent: Aug. 20, 1996

[54] NEGATIVE VOLTAGE DECODING IN NON-VOLATILE MEMORIES

[75] Inventors: Chi-Ming Wang, Fremont; Anil Gupta, Cupertino; Hiten D. S. Randhawa, Santa Clara, all of Calif.

[73] Assignee: Catalyst Semiconductor Corp., Santa Clara, Calif.

[21] Appl. No.: 409,779

[22] Filed: Mar. 24, 1995

[51] Int. Cl.⁶ ..................................................... G11C 7/00
[52] U.S. Cl. ................................ 365/185.18; 365/185.23; 365/185.27
[58] Field of Search ..................................... 365/185, 218, 365/185.18, 185.23, 185.27, 185.11, 185.14, 218, 900

[56] References Cited

U.S. PATENT DOCUMENTS

5,309,402  5/1994  Okazawa .................................. 365/185
5,406,517  4/1995  Chang et al. ............................ 365/185

Primary Examiner—David C. Nelms
Assistant Examiner—Vu A. Le
Attorney, Agent, or Firm—Skjerven, Morrill, MacPherson, Franklin & Friel; David W. Heid; David T. Millers

[57] ABSTRACT

A negative voltage decoder applies a negative voltage to the sense line of a selected row of a memory array but not to sense lines of unselected rows. The negative voltage decoder includes a negative voltage source, an array of P-channel transistors, and a negative voltage address signal generator. P-channel transistors in the array have gates coupled to address lines, so that address signals on the address lines turn on the P-channel transistors and connect only the selected sense line to the negative voltage source. A negative voltage charge pumps in the negative voltage address signal generator generates address signals lower than the negative voltage source. In one embodiment, the transistor array has rows of P-channel transistors which fit the pitch of the memory array and individual P-channel transistors which are stacked laterally away from the memory array, and each row of P-channel transistors couples through a set of individual transistor to a set of sense lines. When a positive voltage decoder applies a positive voltage to the sense lines, the negative voltage address signal generator provides a high voltage to shut off the transistors directly coupled to the sense lines. An isolation circuit isolates the positive voltage row decoder from the negative voltage applied by the negative voltage decoder.

19 Claims, 8 Drawing Sheets

NEGATIVE VOLTAGE DECODING IN NON-VOLATILE MEMORIES

BACKGROUND OF THE INVENTION

1. Field of the Invention

This invention relates to non-volatile semiconductor memories such as EEPROM and flash EPROM which uses negative control gate voltages.

2. Description of Related Art

Non-volatile semiconductor memory such as flash EPROM (electrically programmable read only memory) and EEPROM (electrically erasable programmable read only memory) commonly employ memory cells containing floating gate transistors that trap charge on floating gates. The trapped charge controls the memory cell's threshold voltage and indicates the value of a bit of data. The memory cell is read by sensing whether the cell conducts when a read voltage is applied to the cell's control gate. If the read voltage is greater than the threshold voltage, the memory cell conducts.

For a typical memory cell in an EEPROM or flash EPROM, the trapped charge and the threshold voltage of a memory cell are changed (programmed or erased) by creating a voltage difference between the control gate and an active region in an underlying substrate. The voltage difference attracts electrons to or repels electrons from the floating gate. For example, grounding a control gate and applying 15 volts to a drain of a typical N-channel floating gate transistor causes electron tunnelling from the floating gate to the drain and decreases the floating gate transistor's threshold voltage.

Figure 1A:
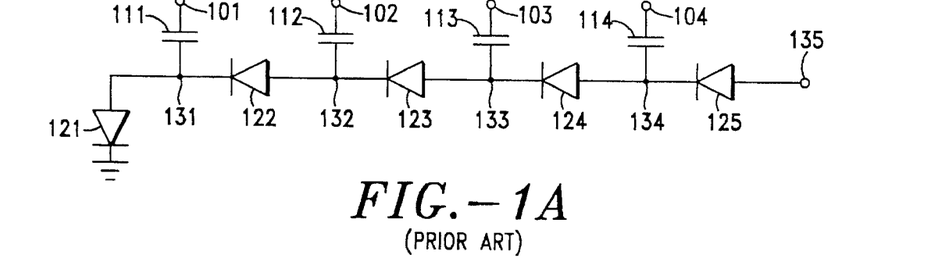
FIG. 1A shows a circuit diagram of a prior art negative voltage charge pump.
Figure 1B:
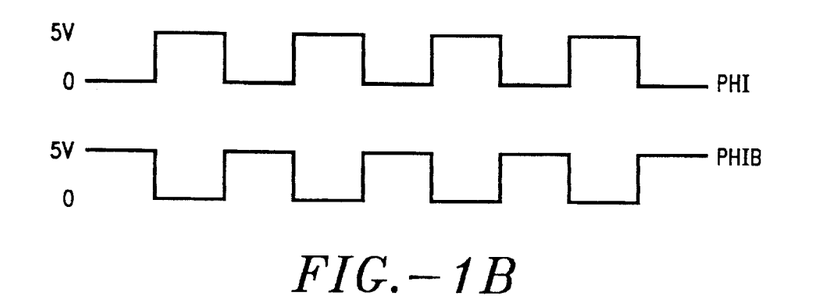
FIG. 1B shows waveforms of periodic positive voltage signals used by a charge pump to generate a negative voltage.

Some flash EPROMs apply a negative control gate voltage (less than a substrate's operating voltage) to decrease a memory cell's threshold voltage and apply a positive control gate voltage (greater than the substrate's operating voltage) to raise the memory cell's threshold voltage. Negative voltages are often provided by a negative voltage charge pump shown in FIG. 1A. In the charge pump of FIG. 1A, a periodic positive voltage signal PHI shown in FIG. 1B is applied to terminals 101 and 103 of capacitors 111 and 113 respectively, and a periodic positive voltage signal PHIB which is 180° out of phase with signal PHI is applied to terminals 102 and 104 of capacitors 112 and 114 respectively. When voltage signal PHI is high (at supply voltage Vcc typically 3 or 5 volts), the voltage at a terminal 131 of capacitor 111 increases in a manner characteristic of an RC circuit. Current flows through diode 121 to ground, and negative charge collects on terminal 131. When voltage signal PHI falls to ground (0 volts), positive charge flows away from a terminal 101 of capacitor 111, but diode 121 restricts current at terminal 131. A negative voltage develops at terminal 131. The next time voltage signal PHI is high, the voltage at terminal 131 increases but not as high as before because more negative charge builds up at terminal 131. In a similar manner, a negative charge and potential builds up at terminals 132, 133, and 134. Because signals PHI and PHIB are out of phase, voltage at terminal 132 is highest when voltage a terminal 131 is lowest. Current through diode 122 lowers the highest voltage at terminal 132 to near lowest voltage at terminal 131. Diodes 123, 124, and 125 similarly keep terminals 133 to 135 at progressively more negative voltages.

Control of both positive and negative voltages in conventional integrated circuits (ICs) presents isolation problems. For example, a positive voltage reverse biases a junction between an N type region and a P type substrate, but a negative voltage on the N type region forward biases the junction causing current leaks between the N type region and the P type substrate. Accordingly, special isolation wells surrounding N type regions are employed to prevent currents when a negative voltage is applied. Forming isolation wells increases the number of processing steps, the size, and the cost of an IC.

Alternatively, isolation circuits prevent application of negative voltage to N type regions. To minimize the amount of isolation circuitry in a memory, typically, all control gates in a memory array are isolated as a block, and negative voltage is simultaneously applied to the control gates of all memory cells in the array. For flash EPROM, the block of memory cells are simultaneously erased by lowering their threshold voltages. To do this, a positive voltage is applied to the drains of memory cells in the block while the control gate voltage is negative.

In EEPROM, each memory cell is individually programmable by lowering its threshold voltage. Applying negative voltage to all of the control gates in the array is undesirable because applying negative voltages to blocks of memory cells may disturb the threshold voltages of unselected memory cells, and repeated application of negative voltages may disturb the charge enough to erroneously change data. Additionally, the combined capacitance of the control gates of a block of memory cells is relatively large. The large capacitance requires a large negative voltage charge pump to charge the control gates quickly, otherwise charging the control gates and reducing the threshold voltage of the selected memory cells takes a long time.

It would be desirable to apply negative voltage to a smaller number of memory cells, for example only to a selected row containing a selected memory cell, but the prior art fails to provide circuits which can be economically integrated into a memory array to apply negative voltages to selected rows.

SUMMARY OF THE INVENTION

In accordance with an embodiment of this invention, a negative voltage decoder applies a negative voltage to the sense line of a selected row of a memory array such as an EEPROM array and not to sense lines of unselected rows. The negative voltage decoder includes a negative voltage source, a transistor array of P-channel transistors, and a negative voltage address signal generator. Address lines from the negative voltage address signal generator cross the transistor array and are coupled to gates of the P-channel transistors. Applying negative voltage address signals to selected address lines turns on transistors in the transistor array that connect a selected sense line to the negative voltage source which provides a negative voltage to the selected sense line. With this embodiment, either one-transistor or multiple-transistor memory cells can be used with negative control gate voltage. Additionally, disturbance of data caused by the negative control gate voltage is reduced.

In accordance with another embodiment of this invention, a non-volatile memory includes: a memory array; sense lines, each coupled to the control gates in a row of memory cells; a negative voltage source; a transistor array of P-channel transistors connected between the sense lines and the negative voltage source; and a negative voltage address signal generator coupled to gates of the P-channel transistors. The transistor array has rows of P-channel transistors with gates coupled to the negative voltage address signal generator via address lines, and each row of P-channel transistors in the array of P-channel transistors is coupled to a unique subset of the address lines. The negative voltage address signal generator generates signals on the address lines which cause only a selected row to conduct and provide a negative voltage from the negative voltage source to a selected sense line.

To turn on a P-channel transistor in the transistor array, the address signals must have a voltage that is lower than the negative voltage of the negative voltage source by more than the threshold voltage of the P-channel transistors. Typically, the negative voltage decoder includes a negative voltage charge pump that provides a voltage more negative than the voltage from the negative voltage source. The charge pump can take the voltage from the negative voltage source and lower the address signals further from that level. In a particular embodiment, two charge pumps, one in the negative voltage address signal generator and one in the negative voltage source, use the same periodic positive voltage for generation of negative voltages.

Different addressing schemes can be employed in different embodiments of this invention. For a fixed number of rows in the memory array, the different addressing schemes change the number of address lines per P-channel transistor in the transistor array. An array of P-channel transistors can be divided into rows of P-channel transistors which fit the pitch of the memory array and individual P-channel transistors which are stacked laterally away from the memory array. One row in the transistor array couples through a set of individual P-channel transistors to a set of sense lines. In an exemplary embodiment, four individual P-channel transistors and associated isolation circuitry connect a single row of P-channel decoder transistors connects to four sense lines. Each of the rows of P-channel transistors has a width less than the combined width of the connected rows of memory cells and therefore the array of P-channel transistors fits the pitch of the memory array.

The memory also includes a positive voltage row decoder which applies positive voltages to the sense lines for reading memory cells and increasing the threshold voltages of memory cells. An isolation circuit between the positive voltage row decoder and the array of P-channel transistors isolates the positive voltage decoder from the negative voltage applied by the negative voltage decoder. Typically, the negative voltage address generator provides a positive voltage higher than the sense line voltage to shut off the P-channel transistors coupled directly to the sense lines.

BRIEF DESCRIPTION OF THE DRAWINGS

Use of the same reference symbols in different figures indicates similar or identical items.

DETAILED DESCRIPTION OF THE PREFERRED EMBODIMENTS

Figure 2:
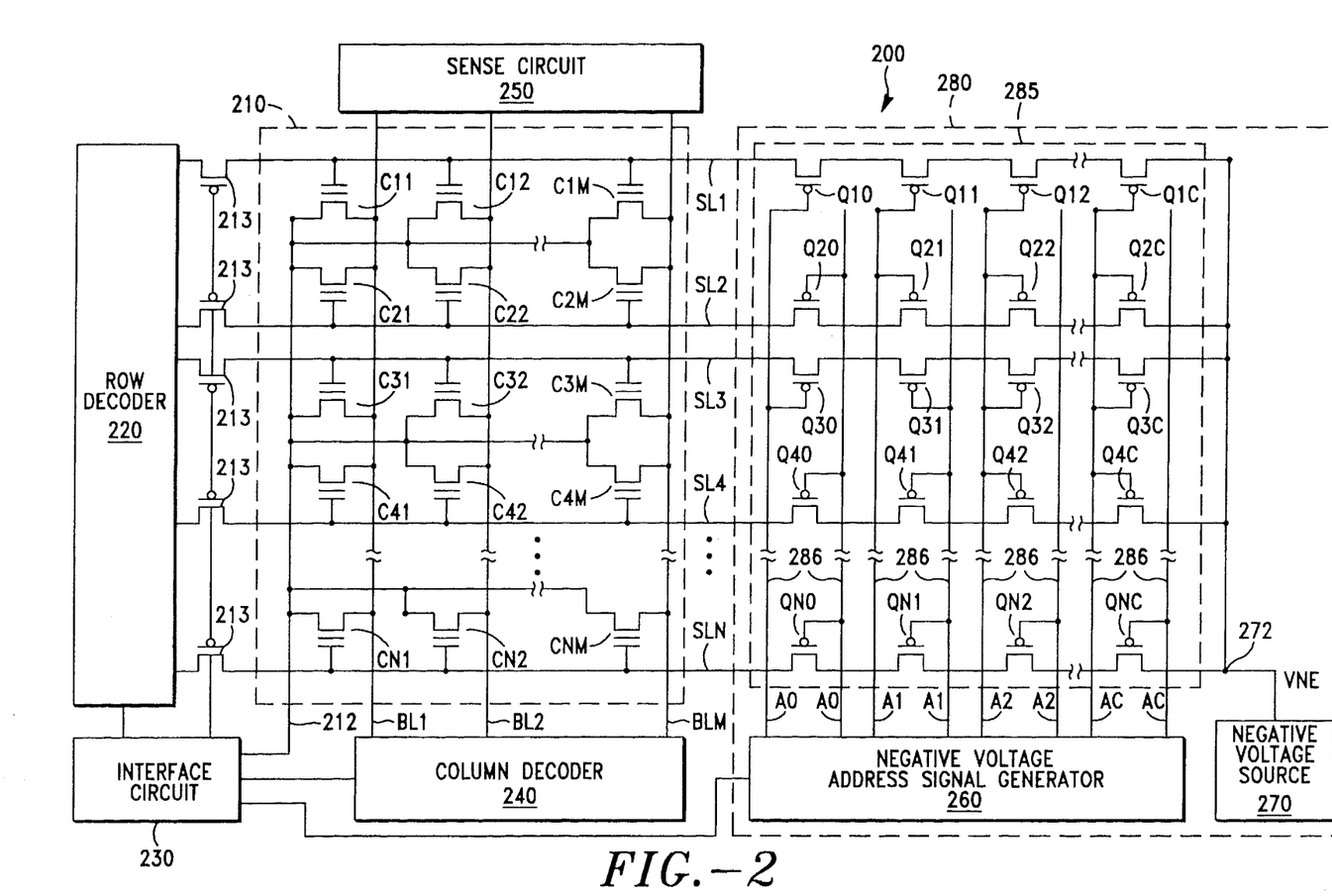
FIG. 2 shows a block diagram of a memory with an array of one-transistor memory cells, in accordance with an embodiment of this invention.

In accordance with an embodiment of this invention, a non-volatile memory 200 of FIG. 2 includes a memory array 210 and a negative voltage row decoder 280. Memory 200 may be, for example an EEPROM (electrically erasable programmable read only memory) or a flash EPROM (electrically programmable read only memory). Rows of memory cells C11 ... C1M to CN1 ... CNM in memory array 210 have control gates coupled to sense lines SL1 to SLN. For single transistor memory cells C11 to CNM, sense lines SL1 to SLN are also commonly referred to as row lines. Negative voltage decoder 280 includes a transistor array 285 with rows of P-channel transistors Q10 ... Q1C to QN0 ... QNC coupled to sense line SL1 to SLN respectively. P-channel transistors in a row of transistor array 285 are connected in series between a negative voltage line 272 and a corresponding sense line. Address lines 286 cross the rows of P-channel transistors Q10 ... Q1C to QN0 ... QNC, and each row P-channel transistors Q10 ... Q1C to QN0 ... QNC has gates connected to a unique combination of address lines 286.

When lowering the threshold voltage of a selected memory cell, address signals A0 to AC and $\overline{A0}$ to $\overline{AC}$ on address lines 286 have voltages that turn on all P-channel transistors in a selected one of rows Q10 ... Q1C to QN0 ... QNC; and those P-channel transistors connect one of sense lines SL1 to SLN to a negative voltage VNE on line 272. All other rows Q10 ... Q1C to QN0 ... QNC in transistor array 285 have different connections to address lines 286 and at least one P-channel transistor that is not turned on by address signals A0 to AC and $\overline{A0}$ to $\overline{AC}$. Accordingly, only the selected sense line is connected to negative voltage VNE, and negative voltage VNE does not disturb the threshold voltage of cells in unselected rows.

Negative voltage source 270 supplies current that charges the selected sense line to a desired negative voltage. The programming speed (the speed at which the threshold voltage of a memory cell can be lowered) for an EEPROM depends on the how quickly the selected sense line reaches the desired negative voltage. An advantage of the invention is that a relatively small current can charge a single sense line, and negative voltage source 270 can be a modest sized charge pump and still provide reasonable programming speed. However, if all sense lines SL1 to SLN in memory array 210 were charged simultaneously a much larger and more expensive charge pump would be required to provide a reasonable programming speed.

Memory 200 is typically formed as a CMOS integrated circuit which has terminals for receiving address signals, data signals, and other input signals from an external circuit (not shown) and output terminals for asserting data signals and other output signals. An interface circuit 230 processes input signals and generates control signals for executing an operation indicated by the input signals.

Memory array 210 includes one-transistor memory cells C11, ..., CNM arranged in N rows and M columns. In the embodiment of FIG. 2, each memory cell C11, ... CNM is an N-channel floating gate transistor fabricated in and on a P type silicon substrate, but other types of memory cells such as split-gate memory cells or two-transistor or three-transistor memory cells may be employed. An embodiment with two-transistor memory cells is disclosed below in regard to FIG. 4. Each of sense lines SL1 to SLN couples to (or forms) control gates for a corresponding row of memory cells C11 ... C1M to CN1 ... CNM respectively. Negative voltage row decoder 280 couples to sense lines SL1 to SLN and supplies a negative voltage to the sense line to decrease the threshold voltage of selected memory cells, i.e. during programming cells of an EEPROM or erasing cells of a Flash EPROM.

In transistor array 285, P-channel transistors Q10 to QNC are arranged in N rows and (C+1) columns. Each row of transistors Q10 ... Q1C to QN0 ... QNC in transistor array 285 contains (C+1) transistors connected in series between a negative voltage source 270 and a corresponding one of sense lines SL1 to SLN. In one embodiment, negative voltage source 270 is a negative voltage charge pump as shown in FIG. 1A which provides negative voltage VNE. An alternative embodiment employs a source of negative voltage which is external to the integrated circuit containing memory array 210.

The number N of rows in transistor array 285 depends on the size of memory array 210. The number (C+1) of columns depends on the addressing scheme used. In transistor array 285, the gates of transistors Q10 to QNC are coupled to address lines 286 with each row of transistors Q10 ... Q1C to QN0 ... QNC being connected to a unique combination (or subset) of address lines 286. When the subset of address lines 286 connected to a selected row of transistors all carry a voltage lower than negative voltage VNE by an amount greater than the transistors' threshold voltage, the transistors in the selected row turn on and connect the corresponding sense line to negative voltage source 270.

A negative voltage address signal generator 260 generates address signals A0 to AC and $\overline{A0}$ to $\overline{AC}$ on address lines 286 in response to signals from interface circuit 230. Interface circuit 230 asserts to row decoder 220 and negative voltage address signal generator 260 multi-bit binary row address signals which indicate a row address of selected memory cells. Typically, in the multi-bit row address signal, supply voltage Vcc represents a bit of the row address that is one, and ground (voltage Vss) represents a bit of the row address that is zero. In the embodiment of FIG. 2, the negative voltage row address signals A0 to AC each represents a bit of the row address, and if a bit in the row address is one, a corresponding one of address signals A0 to AC is low enough to turn on a connected P-channel transistor. If a bit in the row address is zero, the corresponding one of address signals A0 to AC leaves the connected transistors off. Address signals $\overline{A0}$ to $\overline{AC}$ are complementary to negative voltage row address signals A0 to AC respectively.

Figure 3:
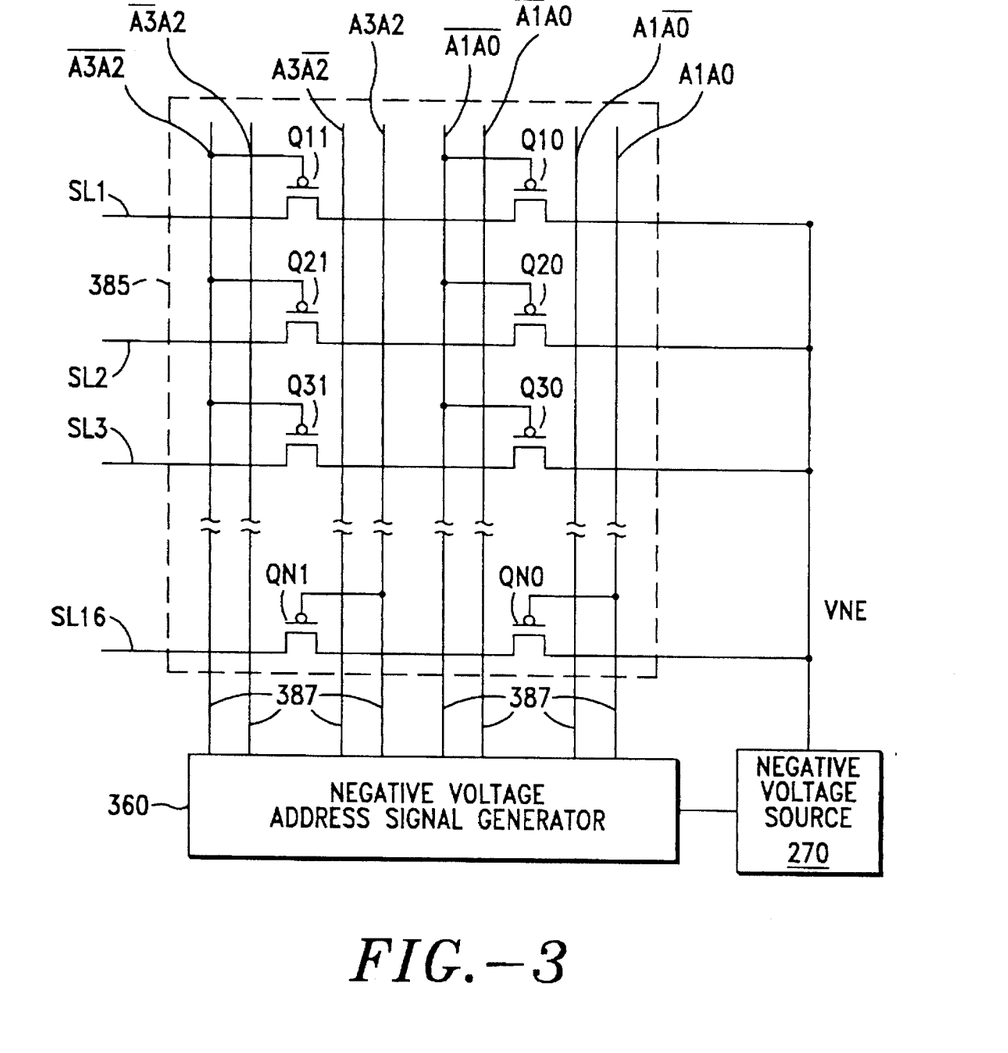
FIG. 3 shows a circuit diagram of a transistor array in accordance with an embodiment of this invention.

FIG. 3 shows a transistor array 385 which may replace transistor array 285 in FIG. 2. Transistor array 385 requires fewer transistors to select a sense line than does transistor array 285. In FIG. 3, transistor array 385 selects one of sixteen sense lines SL1 to SL16 which are indicated by 4-bit row address ranging between 0000 and 1111 binary. Transistor array 385 uses eight address lines and two transistors per row. Transistor array 285 requires eight address lines and four transistors per row to select one of sixteen sense lines. Still another embodiment of a transistor array could employ sixteen address lines and one transistor per row to selected one of sixteen sense lines.

In the embodiment of FIG. 3, a negative voltage address signal generator 360 generates negative row address signals A1A0, A1$\overline{A0}$, $\overline{A1}$A0, $\overline{A1A0}$, A3A2, A3$\overline{A2}$, $\overline{A3}$A2, and $\overline{A3A2}$ which indicate logical combinations of two bits in a row address. For example, signal $\overline{A1}$A0 is at a voltage which turns on transistor Q20 (and other transistors not shown) if in the row address, bit 0 equals 1, and bit 1 equals 0. Signal $\overline{A3A2}$ is at a voltage that turns on transistors Q11, Q21, and Q31 when bits 2 and 3 of the row address are both 0. Accordingly, sense line SL2 is connected to negative voltage source 270 when the row address is 0001 binary. Similarly, sense line SL1 (SL3) is connected to negative voltage source 270 when the row address 0000 (0010).

Many other addressing schemes besides those of transistor arrays 285 (FIG. 2) and 385 (FIG. 3) are possible. For example, some address lines may carry address signals that depend on logical combinations of three or more bits of a row address. With more address lines and signals, fewer transistors are required in the transistor array. The numbers of transistors and address lines may be chosen to minimize the size of the transistor array.

In memory 200 in FIG. 2, a conventional row decoder 220 supplies positive voltages to sense lines SL1 to SLN via P-channel transistors 213 for reading memory cells or raising the threshold voltages of memory cells. Row decoders for supplying positive voltage are well known in the art and not described further herein. When conventional row decoder 220 applies positive voltage to the sense lines SL1 to SLN, negative voltage address signal generator 260 disables transistors Q10 to QNC and prevents the positive voltage on sense lines SL1 to SLN from reaching negative voltage source 270.

During reading of selected ones of memory cells C11 to CNM, interface circuit 230 grounds source line 212, supplies a row address to row decoder 220, a column address to a column decoder 240, and a signal which disables negative voltage row decoder 280. Row decoder 220 applies a positive voltage (typically about 2 to 5 volts) to the selected sense line. Column decoder 240 applies a positive voltage (typically about 1 volt) to one or more of selected bit lines BL1 to BLM. A sense circuit 250 senses either the current or the voltage on the selected bit lines to determine if any of selected cells have a threshold voltage below the voltage applied by row decoder 220.

When increasing the threshold voltage of a row of memory cells C11 ... C1M to CN1 ... CNM by Fowler-Nordheim tunneling (FNT), row decoder 220 applies a positive voltage (typically about 20 volts for an EEPROM) to a selected one of sense lines SL1 to SLN. Interface circuit 230 grounds source line 212, which in turn grounds all of bit lines BL1 to BLM.

When increasing the threshold voltage of one or more of memory cells C11 to CNM by channel hot electron injection row decoder 220 applies a positive voltage (typically about 15 volts for an EPROM or Flash) to selected ones of sense lines SL1 to SLN. Interface circuit 230 ground sources line 212, and column decoder 240 raises selected ones of bit lines BL1 to BLM to a positive voltage sufficiently high to create channel currents containing electrons energetic enough to reach the floating gate of the cells being programmed.

To isolate negative voltage source 270 from the positive voltage on sense lines SL1 to SLN, negative voltage address signal generator 260 asserts address signals A0 and $\overline{A0}$ at a voltage about equal or above the voltage on sense line SL1 to SLN so that P-channel transistors Q10 to QN0, which are directly coupled to sense lines SL1 to SLN, are off. Lower gate voltages are sufficient for transistors in columns Q11 . . . QN1 to Q1C . . . QNC because transistors Q10 to QN0 disable transistors Q11 to QNC regardless of the gate voltages of transistors Q11 to QNC.

When decreasing the threshold voltage of selected ones of memory cells C11 to CNM, interface circuit 230 permits the voltage on source line 212 to float, turns off transistors 213, supplies a row address signal to negative voltage row decoder 280, and supplies a column address to a column decoder 240. Negative voltage decoder 280 applies a negative voltage (such as −5 volts) to a selected one of sense lines SL1 to SLN as indicated by the row address signal. Column decoder 240 applies a positive voltage (such as 10 volts) to one or more of selected bit lines BL1 to BLM. The voltage difference between the control gate and drain of a memory cell in a row selected by negative voltage row decoder 280 and in a column selected by column decoder 240 is −15 volts and decreases the threshold voltage of the selected memory cell.

Transistors 213 are off and isolate N-channel devices in row decoder 220 from the negative voltage on the selected sense line. In FIG. 2, transistor array 285 is on a side of memory array 210 opposite row decoder 220 and transistors 213. However, such an arrangement is not required. Isolation circuits such as P-channel transistors 213 may be adjacent to transistor array 285, or transistor array 285 and row decoder 220 can be interwoven with each other or with isolation circuitry.

Figure 4:
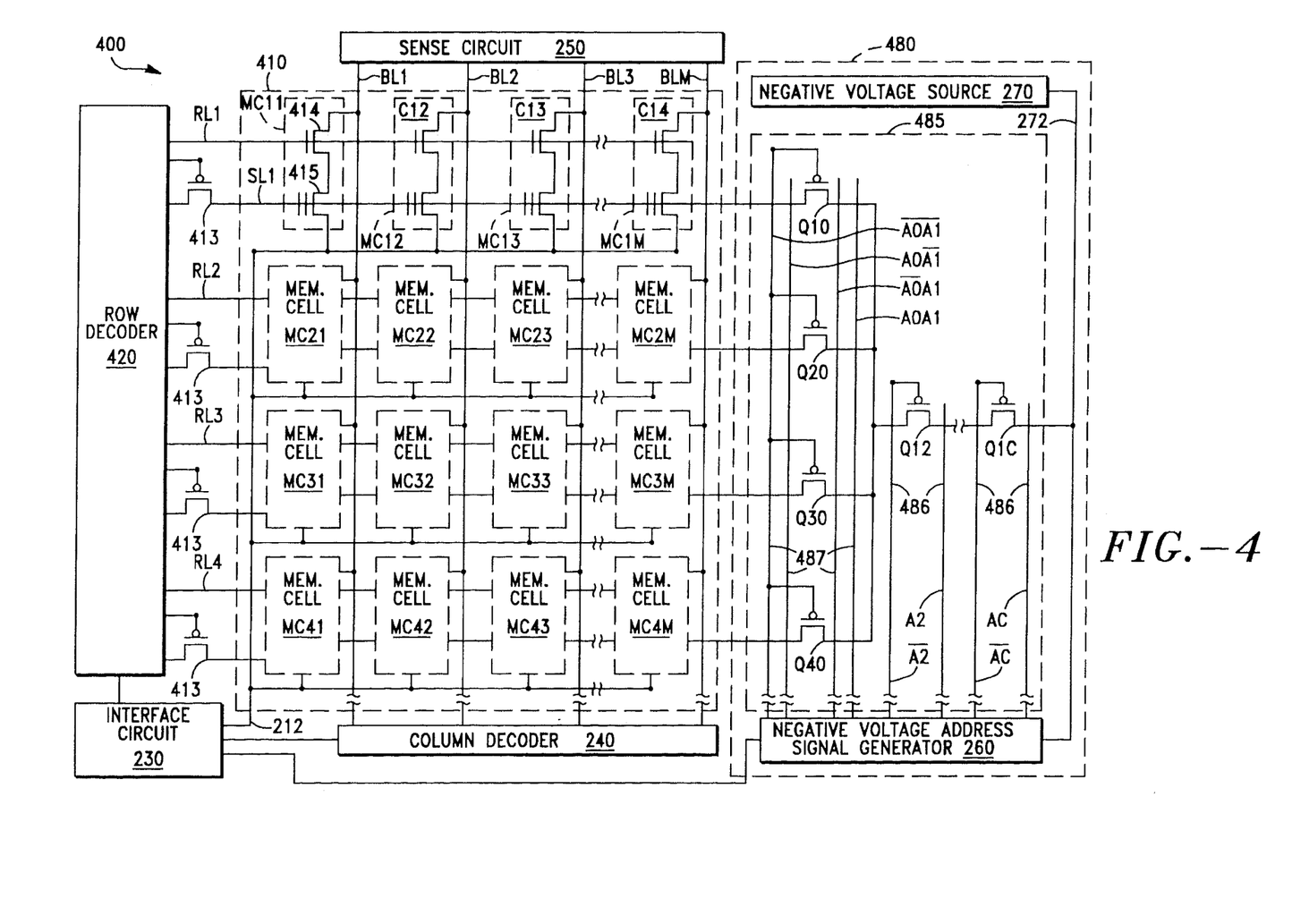
FIG. 4 shows a memory with an array of two-transistor memory cells, in accordance with another embodiment of this invention.

FIG. 4 shows a block diagram of a memory 400 in accordance with another embodiment of this invention. In FIG. 4, only the first four rows of memory cells MC11 to MC4M and the portion of a transistor array 485 which provides negative voltage to sense lines SL1 to SL4 are represented. A complete memory array 410 according to this embodiment includes N rows of memory cells and N sense lines SL1 to SLN where N is a multiple of four. Each set of four rows of memory cells is identical to memory cells MC11 to MC4M, and each portion of transistor array 485 that provides negative voltages to a set of four rows is the same as the portion shown in FIG. 4 except for connections to address lines 486.

In transistor array 485, each of address signals $\overline{A0A1}$, A0$\overline{A1}$, $\overline{A0}$A1, and A0A1 on address lines 487 depends on two bits (bits 0 and 1) of the row address, and each of address signals A2 to AC and $\overline{A2}$ to $\overline{AC}$ on address lines 486 depends on a corresponding one of bits 2 to C of the row address. Comparing memory 200 of FIG. 2 with memory 400 of FIG. 4, providing four address lines 487 for transistors Q10 to Q40 reduces the number of transistors in transistor array 485 by one per sense line. The number of transistors in transistor array 485 is further reduced from the number in transistor array 285 by replacing four rows of transistors Q12 . . . Q1C to Q42 . . . Q4C of transistor array 285 with a single row of transistors Q12 . . . Q1C. A similar replacement is done for every other set of four rows (not shown). This can be done because the row addresses for four consecutive rows in the sets are identical except for bits 0 and 1, and the connections of address lines 486 in transistor array 485 correspond to the most significant bits of the row address.

Memory 400 also differs from memory 200 in that each of memory cells MC11 to MCNM contains a pair of transistors, a field effect transistor (FET) 414 and a floating gate transistor 415. FETs 414 in memory cell rows MC11 . . . MC1M to MCN1 . . . MCNM are connected to lines RL1 to RLN referred to herein as row lines, and floating gate transistors 415 in rows MC11 . . . MC1M to MCN1 . . . MCNM are connected to lines SL1 to SLN referred to herein as sense lines. When reducing the threshold voltage of selected floating gate transistors 415, negative voltage is applied to selected ones of sense lines SL1 to SLN, but is not applied to any of row lines RL1 to RLN. Accordingly, a positive voltage row decoder 420 is isolated from selected sense lines SL1 to SLN by P-channel transistors 413 but does not need to be isolated from row lines RL1 to RLN.

Interface circuit 230 controls the voltage of source line 212 and causes row decoder 420 and negative voltage row decoder 480 to select the same row of memory cells for programming, erasing, or reading selected memory cells. To decrease the threshold voltage of a selected cell MC11, interface circuit 230 causes sources line 212 to float. Negative voltage row decoder 480 applies negative voltage VNE (typically about −5 volts) from negative voltage source 270 to the selected sense line SL1 and disconnects negative voltage source 270 from unselected sense lines SL2 to SLN. Row decoder 420 grounds unselected row lines RL2 to RL4 and applies a positive voltage (typically above 10 volts) to selected row line RL1 to turn on transistor 414 in memory cell MC11. Transistors 413 are off to isolate row decoder 420 from negative voltage. Column decoder 240 applies a positive voltage (typically about 10 volts) to the selected bit line BL1, and does not apply the positive voltage (10 volts) to unselected bit lines BL2 to BLM. Voltage difference between selected sense lines and selected bit lines causes tunneling, such as FNT or band-to-band tunneling, which decreases the threshold voltage of selected memory cells.

For FNT to increase the threshold voltage a selected row, row decoder 420 applies 5 volts to the selected row line, applies a positive sense line voltage VE (typically about 20 volts) to the selected sense line, and grounds unselected row and sense lines. Interface circuit 230 ground source line 212, which in turn grounds all of bit lines BL1 to BLM. A negative voltage address signal generator 460 turns off transistors Q10 to QN0 to isolate negative voltage source 270 from positive voltage on sense lines SL1 to SLN.

Increasing the threshold voltage of a selected row sets all memory cell in the selected row in an "off" state. In an EEPROM, a cycle which increases the threshold voltages of a row is followed by a cycle which selectively lowers the threshold voltages (e.g. applies −5 volts and 10 volts to sense line and bit lines respectively as described above) of selected memory cells in the row to an "on" state. This two-cycle process leaves the memory cells in the selected row with a pattern of "off" and "on" states which indicates the data stored in the row.

To read a selected cell MC11, row decoder 420 applies 5 volts to the selected row line RL1, grounds unselected row lines RL2 to RLN, applies a sense line read voltage VR (typically 2 to 3 volts) to the selected sense line SL1, and grounds unselected sense lines SL2 to SLN. Column decoder 240 applies 1 volt to the selected bit line BL1 and grounds unselected bit lines BL2 to BLM. Interface circuit 230 grounds source line 212. Negative voltage address signal generator 460 turns off transistors Q10 to QN0 to isolate negative voltage source 270 from positive voltage on sense lines SL1 to SLN. If selected cell MC11 is in the "on" state, selected cell MC11 conducts. Cell MC11 does not conduct when in the "off" state.

Figure 5A:
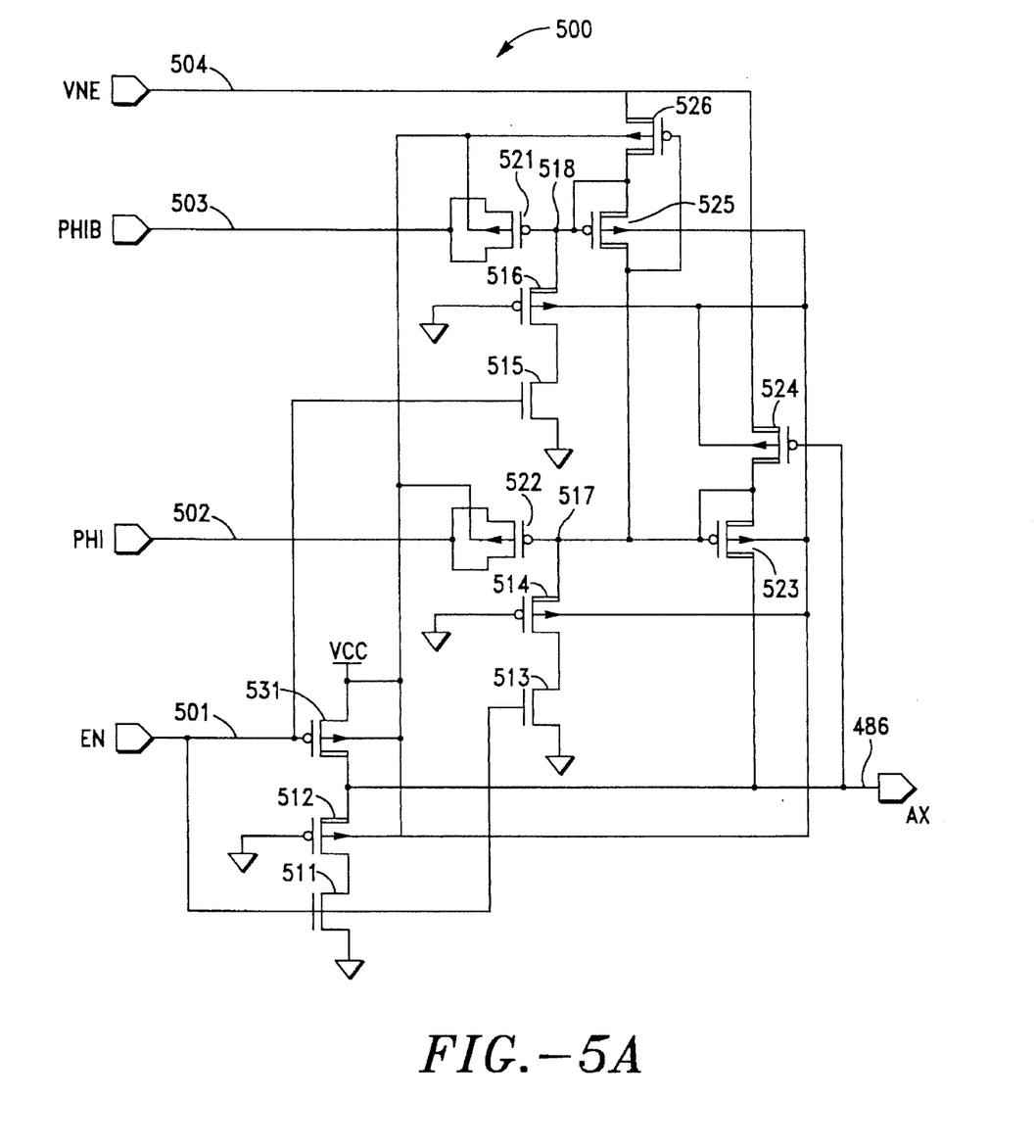
FIGS. 5A and 5B show circuit diagrams of portions of a negative voltage address signal generator for the embodiment of FIG. 4.

FIG. 5A shows a circuit 500 which generates a negative voltage address signal AX. Negative voltage address signal generator 460 (FIG. 4) contains one circuits like circuit 500 for each address signal A2 to AC and $\overline{A2}$ to $\overline{AC}$. Circuit 500 acts on an input signal EN on a line 501. Signal EN is high (at voltage Vcc) when a corresponding bit in the row address for a selected row is one and is low (grounded) when the corresponding bit in the row address is zero. When signal EN is high, circuit 500 pulls signal AX below negative voltage VNE on a line 504 by more than the threshold voltage of the P-channel transistors Q12 to QNC in transistor array 485.

A P-channel transistor 512 and an N-channel transistor 511 are coupled in series between line 486 and ground and have gates coupled to ground and line 501 respectively. When signal EN is high, transistors 511 and 512 keep signal AX less than or about equal to threshold voltage of transistor 512. Similarly, when EN is high, a P-channel transistor 514 and an N-channel transistor 513 keep the voltage on a node 517 less than about the threshold voltage of transistor 514. A PMOS capacitor 522 has a first line coupled to node 517 and a second line 502 which receives voltage signal PHI which is shown in FIG. 1B. By limiting the positive voltage on node 517 when signal PHI rises, transistors 514 and 513 cause negative charge and a negative voltage to build on node 517 when signal EN is high. Transistors 516 and 515, PMOS capacitor 521, and signal PHIB similarly build a negative charge and voltage on a node 518.

P-channel transistors 523 and 525 keep signal AX lower than the voltage on node 518. P-channel transistor 523 has a gate and a drain coupled to node 517 and a source coupled to line 486, so that transistor 523 acts as a diode. If signal AX is at a voltage greater than the voltage on node 517 by more than the threshold voltage of transistor 523, transistor 523 conducts and lowers the voltage of signal AX. P-channel transistor 525 has a gate and a drain coupled to node 518 and a source coupled to node 517 and also acts as a diode. If the voltage on node 517 is greater than the voltage on node 518 by more than the threshold voltage of transistor 525, transistor 525 conducts and lowers the voltage on node 517. Since signals PHI and PHIB are out of phase, the voltage on node 517 is at a maximum when the voltage on node 518 is at a minimum, and transistor 525 tends to decrease the maximum voltage at node 517 to the minimum voltage at node 518.

A transistor 526, which is between line 504 and node 518, has a gate coupled to node 517. When the voltage at node 517 is less than negative voltage VNE by more than the threshold voltage of transistor 526, transistor 526 connects node 518 to negative voltage VNE. Typically, transistor 526 conducts when node 517 is near its minimum voltage and node 518 is near its maximum voltage. Accordingly, the maximum voltage at node 518 is near voltage VNE. P-channel transistors 524 and 523 operate in a manner similar to that of transistors 526 and 525 to keep the maximum voltage of signal AX below negative voltage VNE.

When signal EN is low, transistors 513 and 515 are off and stop the accumulation of negative charge at nodes 518 and 517. Transistor 511 is also off, and a P-channel transistor 531 pulls signal AX up to voltage Vcc. Since transistors Q12 to QNC are not directly coupled to sense lines SL1 to SLN and are not subjected to voltages above voltage Vcc, voltage Vcc shuts off connected P-channel transistors.

Figure 5B:
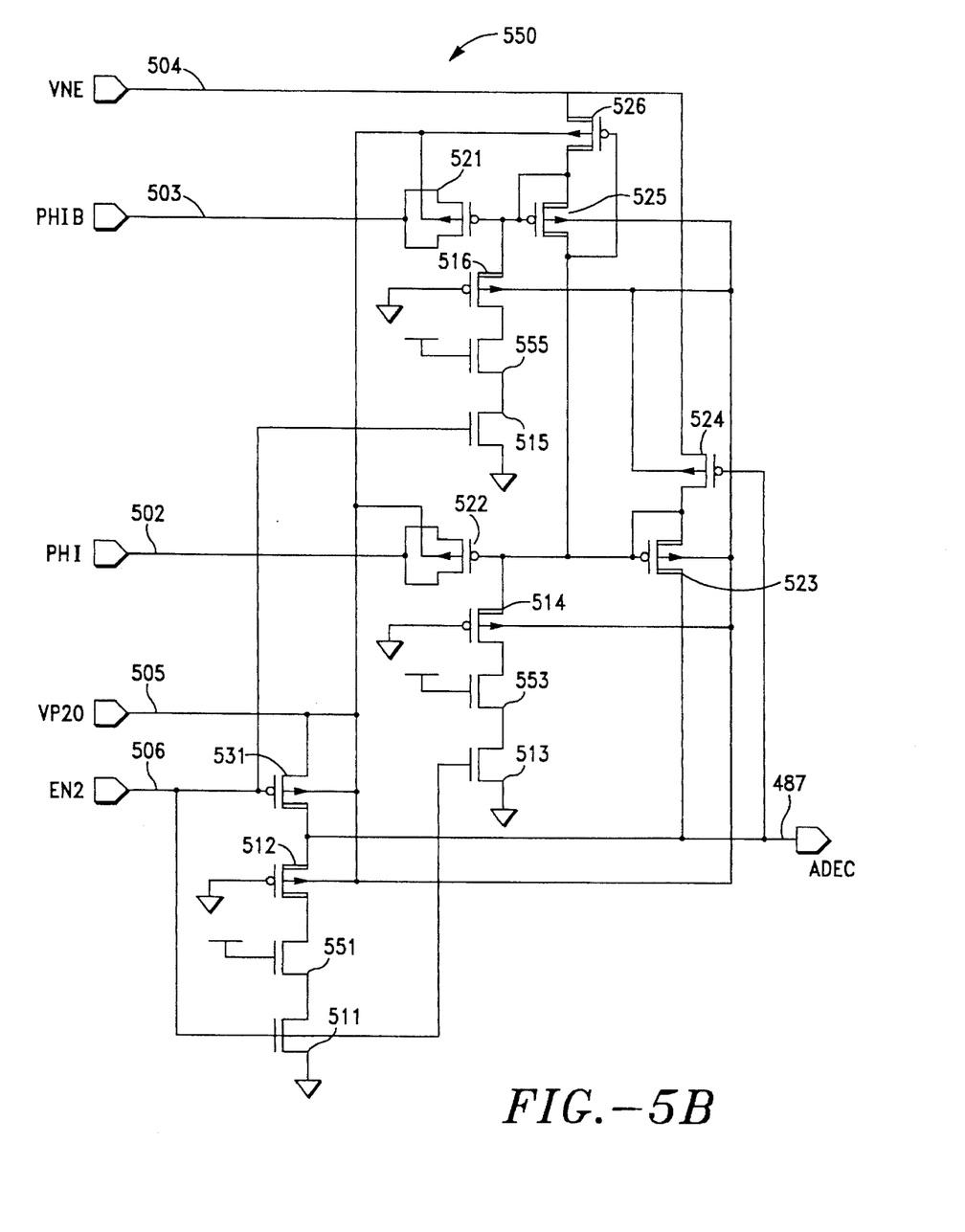

FIG. 5B illustrates a circuit 550 which generates a negative voltage address signal ADEC. Negative voltage address signal generator 460 (FIG. 4) contains four such circuits 550, one for each of address signals $\overline{A0A1}$, A0$\overline{A1}$, $\overline{A0}$A1, and A0A1. Address signal ADEC is set to a voltage which turns on connected ones of P-channel transistor Q10 to QN0 in transistor array 485 when a signal EN2 on a line 506 is high and turns off connected ones of P-channel transistor Q10 to QN0 when signal EN2 is low. Signal EN2 is high (or low) when decreasing the threshold voltage of a selected memory cell if a corresponding logical combination of bits 0 and 1 of a row address of the selected cell are true (or false). Signal EN2 is low during a read or increasing of the threshold voltage of a memory cell.

Circuit 550 differs from circuit 500 in that circuit 550 must turn off P-channel transistors Q10 to QN0 which are directly coupled to sense lines SL1 to SLN and are subjected to sense line voltage VE (typically about 20 volts) which is higher than voltage Vcc (typically about 5 volts). When signal EN2 is low, circuit 550 raises signal ADEC to the voltage of a signal VP20. When increasing the threshold voltage of a cell, signal VP20 is at voltage VE, otherwise signal VP20 is at voltage Vcc. When increasing the threshold voltage of memory array 410, the voltages on the selected ones of sense lines SL1 to SLN and on the gates of transistors Q10 to QN0 equal sense line voltage VE. Transistors Q10 to QN0 are off and prevent sense line voltage VE from reaching transistors Q12 to QNC or negative voltage source 270.

Circuit 550 contains elements that are the same as and have the same reference symbols as elements of circuit 500 in FIG. 5A. The above disclosure in regard to FIG. 5A describes these elements and their function. In circuit 550, N-channel transistors 551, 553, and 555 have gates coupled to voltage Vcc and are in series with transistors 511 and 512, 513 and 514, and 515 and 516 respectively to prevent snapback which may otherwise result when switching the high voltage VE.

Figure 6:
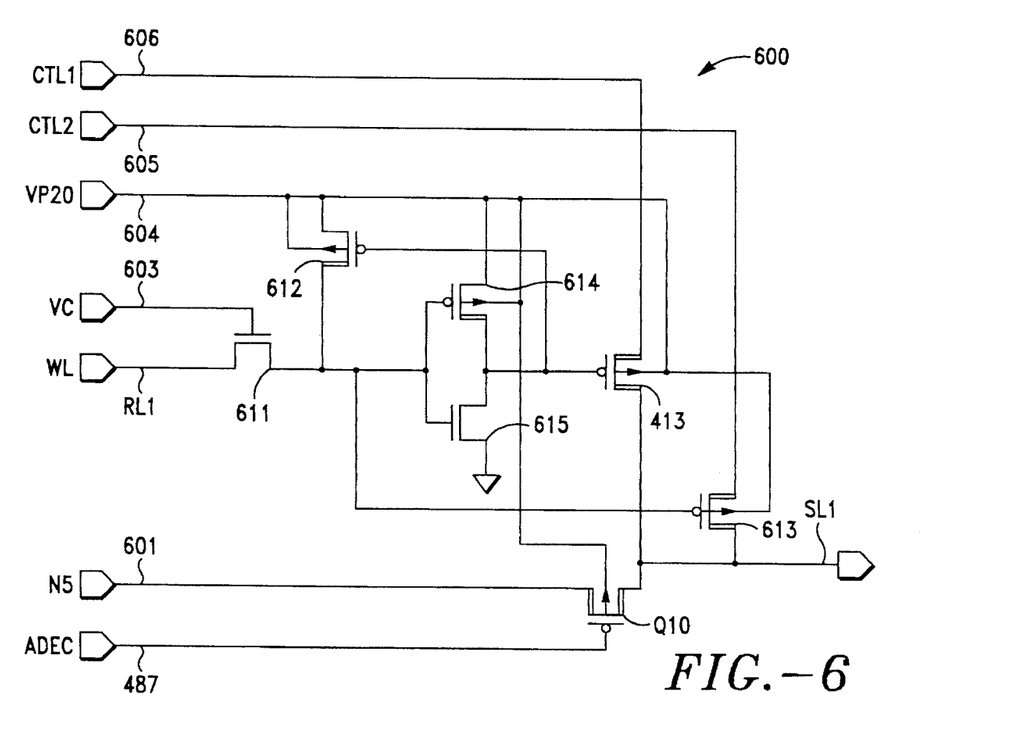
FIG. 6 shows a circuit diagram of decode and isolation circuitry for a sense line of the embodiment of FIG. 4.

FIG. 6 shows a circuit 600 for control of the voltage on sense line SL1 of FIG. 4 and for isolation of N-channel devices from negative voltage VNE on sense line SL1. Memory 400 of FIG. 4 contains one circuit like circuit 600 for each of sense lines SL1 to SLN. In FIG. 6, three P-channel transistors Q10, 413, and 613 have active regions coupled to source line SL1. Transistor Q10 provides negative voltage VNE for sense line SL1. High voltage VE and read voltage VR for sense line SL1 are provided through transistor 413 which also isolates N-channel devices from negative voltage on sense line SL1. Transistor 613 turns on when sense line SL1 is unselected.

When decreasing the threshold voltage of a selected memory cell MC11 attached to selected sense line SL1, transistors Q12 to Q1C (FIG. 4) are turned on by address signals $\overline{A2}$ to $\overline{AC}$ from circuits such as shown in FIG. 5A. Transistors Q12 to Q1C conduct and provide on a line 601 of transistor Q10 a signal N5 which is at negative voltage VNE. A circuit as shown in FIG. 5B provides address signal ADEC which turns on transistor Q10 so that signal N5 is asserted to sense line SL1. Row line RL1 is also coupled to the selected memory cell, and a signal WL on selected row line RL1 is high (at voltage Vcc). A signal VC on line 603 is high when decreasing the threshold voltage of the selected cell so that an N-channel transistor 611 conducts signal WL to the gate of transistor 613. Transistor 613 turns off thereby isolating N-channel devices in row decoder 420 from the negative voltage on sense line SL1. A P-channel transistor 614 and an N-channel transistor 615 form an inverter which inverts signals from transistors 611 and 612. Inverting signal WL from transistor 611 grounds the gates of transistors 413 and 612. Transistor 612 conducts when negative voltage is applied to sense line SL1, but signal VP20 is at voltage Vcc and does not change the gate voltage of transistors 613, 614, or 615. Transistor 413 is off because the voltage on sense line SL1 is negative and signal CTL1 on line 606 is grounded making the gate-drain voltage less than the threshold voltage of transistor 413.

If sense line SL1 is unselected, transistor Q10 is off, and signal WL is low. Signal WL passes through transistor 611 turns on transistor 613. Transistor 613 conducts to sense line SL1 a signal CTL2 which is at voltage VR when the voltage of a selected memory cell is being decreased. Signal WL on the gate of transistor 614 raises the gate voltages of transistors 612 and 413 turning off transistors 612 and 413.

During a read, signal ADEC is high, and transistor Q10 is off. If a selected memory cell to be read is coupled to sense line SL1, signals WL and VC are high, and N-channel transistor 611 conducts and turns off transistor 613. Transistor 615 grounds the gate of transistor 413 so that transistor 413 provides to sense line SL1 signal CTL1 which is at voltage VR during the read.

If the memory cell being read is not coupled to sense line SL1, signal WL is low and turns on transistor 613 which connects sense line SL1 to signal CTL2 which at voltage VR during a read operation, but none of the cells coupled to sense line SL1 conduct because row line RL1 for the memory cells is low and shuts off FETs 414 coupled to row line RL1.

When raising the threshold voltage of a selected memory cells, signals WL and VC are at supply voltage Vcc for all selected rows. Signal VP20 is at voltage VE which is higher than supply voltage Vcc. Initially, signal WL through transistor 611 causes transistor 615 to conduct and turn on transistors 612 and 413. Transistor 413 connects sense line SL1 to line 606 and signal CTL1 which is at voltage VE. Transistor 612 conducts and raises the gate voltages of transistors 613, 614, and 615 to about voltage VE. Transistor 611 stops conducting when the voltage from transistor 612 is above about voltage Vcc. This protects row decoder 420 from the high voltage VE. Transistor 613 remains off.

Figure 7A:
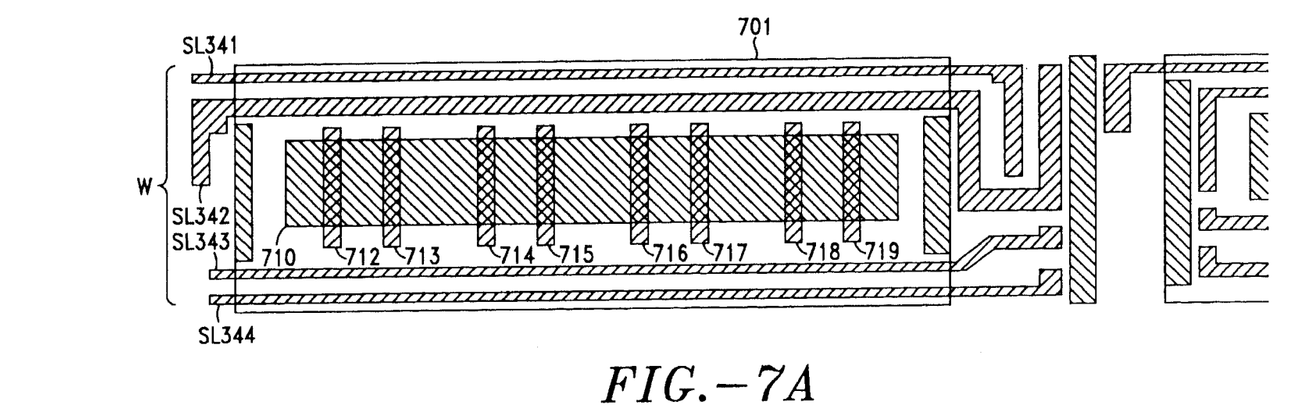
FIGS. 7A and 7B show a plan view of a portion of a negative voltage decoder in accordance with this invention.
Figure 7B:
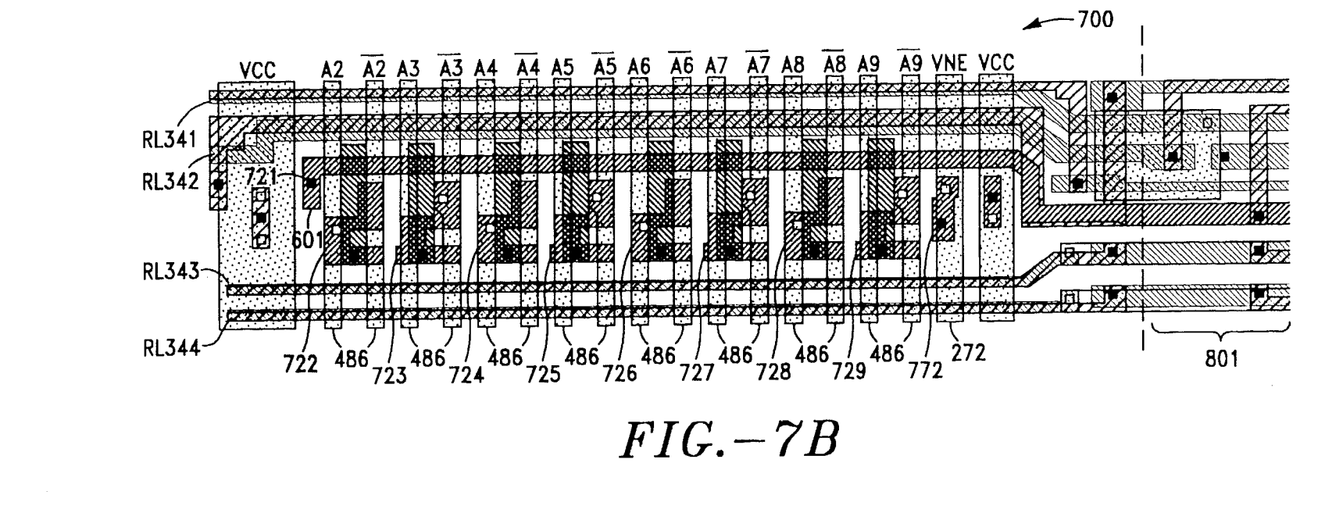

FIGS. 7A and 7B shows a plan view of a decoder row 700 of P-channel transistors in transistor array 485 in accordance with an embodiment of FIG. 4. FIG. 7A shows N-well and active regions in the silicon substrate, and polysilicon regions overly and insulated from the silicon substrate except at contacts. N-well 701 contains active region 710 of the P-channel transistors which form decoder row 700. Decoder row 700 decodes bits 2 to 9 of a 10-bit row address and identifies whether the row address corresponds to a particular set of four consecutive rows of memory cells in memory array 410 (FIG. 4). Address signals A2 to A9 and $\overline{A2}$ to $\overline{A9}$ on address lines 486 indicate the values of bits 2 to 9 respectively of the row address. Decoder row 700 has a width W equal to the sum of the widths of the four consecutive rows of memory cells and therefore fits within the pitch of memory array 410. Additional decoder and isolation circuitry, such as shown in FIGS. 6 and 8, for the four rows of memory cells served by decoder row 700 is spaced laterally from decoder row 700.

In FIG. 7A, eight P-channel transistors are formed in and over active region 710. One end of active region 710 couples to negative voltage line 272 via a contact structure 772. Negative voltage line 272 is formed in a second metal layer overlying the substrate. Eight polysilicon regions 712 to 719 overlie active region 710 between contact structure 772 and a second contact 721. Contact 721 connects active region 710 to line 601 which is formed from a first metal layer overlying the substrate. Line 601 provides signal N5 to four copies of circuit 600 of FIG. 6, one copy for each sense line in the set of four rows of memory cells.

Contacts between polysilicon gates 712 to 719 and address lines 486 are made via metal regions 722 to 729 respectively. Address lines 486 are formed from the second metal layer overlying the substrate. Metal regions 722 to 729 are formed from the first metal layer overlying the substrate. The row address which causes decoder 700 to lower signal N5 to voltage VNE depends on which of address lines 486 are connected to metal regions 722 to 729. FIG. 7B shows an example where signals $\overline{A9}$, A8, $\overline{A7}$, A6, $\overline{A5}$, A4, $\overline{A3}$, and A2 are asserted to gates 719 to 712. Signal N5 is lowered to voltage VNE for a 10-bit row addresses equal to 01010101xx binary where x can be either 0 or 1. As disclosed above, a full memory contains one row of P-channel transistors such as decoder row 700 for every four sense lines. Each of these rows has different connections to address lines 486.

Figure 8A:
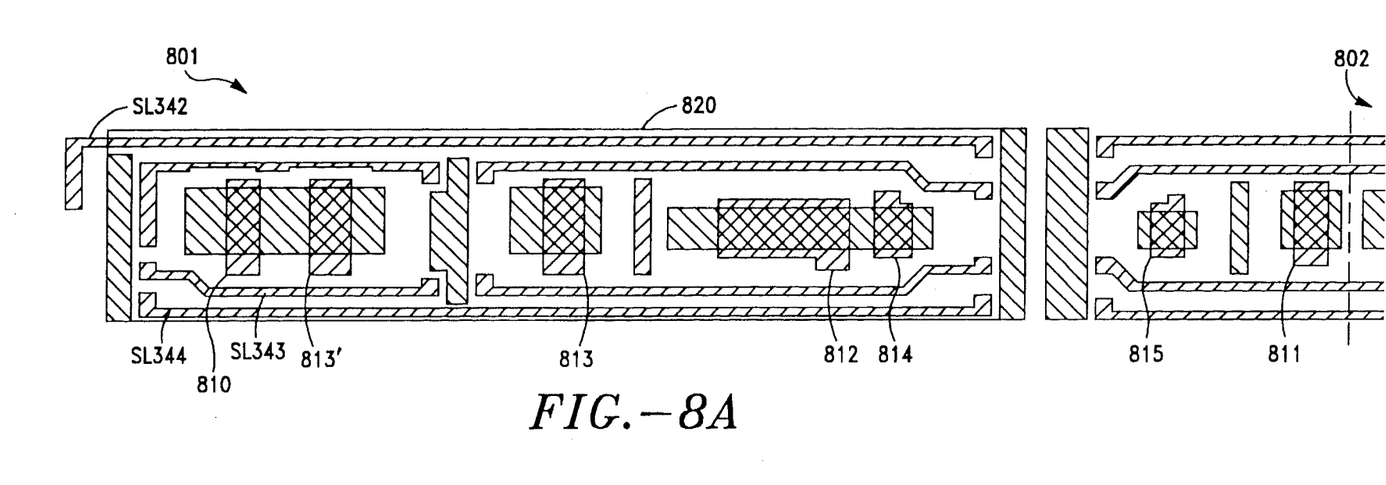
FIGS. 8A and 8B show a plan view of the circuit of FIG. 6.
Figure 8B:
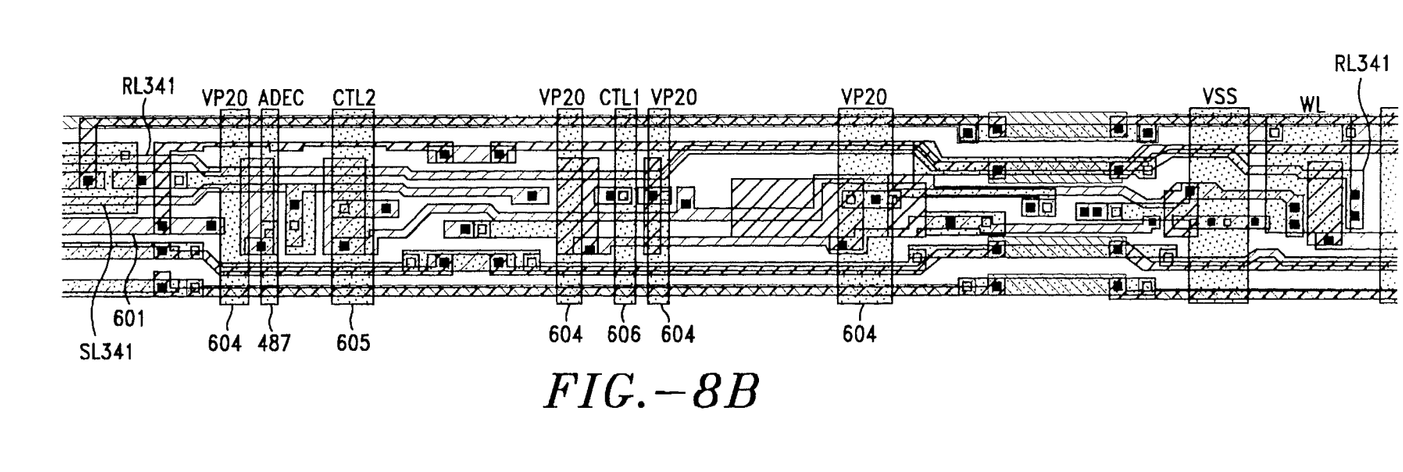

Sense lines SL341 to SL344 (and corresponding row lines RL341 to RL344) are formed from polysilicon (and the first metal layer) and pass through FIGS. 7A and 7B for connection to the additional decoder circuitry such as shown in FIGS. 8A and 8B.

FIGS. 8A and 8B show a plan view of a circuit 801 which contains the same elements as circuit 600 of FIG. 6. Circuit 801 has a width equal to width W of decoder row 700 and is disposed between decoder row 700 and a circuit 802. Circuit 801 provides additional decoding and isolation circuitry for sense line SL341.

Lines coupled to row lines RL342 to RL 344 and sense lines SL342 to SL344 pass through circuit 801 to a circuit 802. Circuit 802 and two other similar copies (not shown) of circuit 801 provide additional decoding and isolation circuitry for sense lines SL342, SL343, and SL344.

Circuit 801 contains lines 487, 601, and 603 to 606 which are described in connection with FIG. 6. Lines RL341 and SL341 operate in the same manner as lines RL1 and SL1 described in connection with FIG. 6. Polysilicon regions 811 and 815 form the gates of N-channel transistors 611 and 615 respectively. Polysilicon regions 810, 812, 813, and 813' form the gates of P-channel transistors Q10, 612, 613, and 413 respectively, in an N-well 820.

Decoder row 700 (FIGS. 7A and 7B), circuit 801 (FIGS. 8A and 8B), and memory array 410 (FIG. 4) are made using conventional integrated circuit fabrication techniques. Such fabrication techniques are well known in the art and not described further herein.

Although the present invention has been described with reference to particular embodiments, the description is only an example of the invention's application and should not be taken as a limitation. Various other combinations and adaptations of the features disclosed herein will be apparent in view of this disclosure.

We claim:

1. A non-volatile memory comprising:

a memory array containing rows of memory cells, each memory cell having a control gate;

a plurality of sense lines, each sense line being coupled to the control gates of memory cells in a corresponding row of the memory array;

a negative voltage source;

an array of P-channel transistors connected between the sense lines and the negative voltage source; and a negative voltage address signal generator coupled to gates of the P-channel transistors and providing gate voltages which cause the array of P-channel transistor to conduct a first negative voltage from the negative voltage source to a selected one of the rows of memory cells.

2. The non-volatile memory of claim 1, further comprising address lines coupled to the negative voltage address signal generator, wherein:

the array of P-channel transistors comprises rows of P-channel transistors;

the P-channel transistors in each row are connected in series between the negative voltage source and the sense lines; and gates of the P-channel transistors in each row are coupled to the negative voltage address signal generator via a subset of the address lines, which is unique to the row.

3. The non-volatile memory of claim 2, wherein the memory array has a pitch determined by the size of the memory cells, and the rows of P-channel transistor fit the pitch of the memory array.

4. The non-volatile memory of claim 2, wherein:

the array of P-channel transistors further comprises individual P-channel transistors;

each of the sense lines is coupled to a corresponding one of the individual P-channel; and each of the rows of P-channel transistors in the array of P-channel transistors is coupled between the negative voltage source and at least one of the individual P-channel transistors.

5. The non-volatile memory of claim 4, wherein:

each of the rows of P-channel transistors in the array of P-channel transistors is coupled through N of the individual P-channel transistors to N sense lines in the memory array, where N is an integer greater than one; and each of the rows of P-channel transistors has a width less than or equal to a combined width of N rows of memory cells in the memory array.

6. The non-volatile memory of claim 5, wherein N is four.

7. The non-volatile memory of claim 4, further comprising:

a positive voltage row decoder coupled to the sense lines and applying a positive voltage to the sense lines; and an isolation circuit connected between the positive voltage row decoder and the array of P-channel transistors.

8. The non-volatile memory of claim 7, wherein the negative voltage address signal generator comprises:

a first circuit providing a first shut-off voltage to address lines coupled to the individual P-channel transistors, while the positive voltage decoder applies the positive voltage to the sense lines; and a second circuit providing a second shut-off voltage to the address lines coupled to the rows of P-channel transistors, while the positive voltage decoder applies the positive voltage to the sense lines, wherein the first shut-off voltage is greater than the second shut-off voltage.

9. The non-volatile memory of claim 2, wherein:

the negative voltage address signal generator comprises a negative voltage charge pump that provides a second negative voltage; and the second negative voltage is more negative than the first negative voltage.

10. The non-volatile memory of claim 9, wherein the negative voltage charge pump is coupled to the negative voltage source.

11. The non-volatile memory of claim 10, wherein: the negative voltage source comprises:

a first diode having a cathode coupled to a reference voltage;

a second capacitor having a cathode coupled to an anode of the first diode;

a first capacitor having a first terminal for receiving a first periodic positive voltage signal and a second terminal coupled to the anode of the first diode;

a second capacitor having a first terminal for receiving a second periodic positive voltage signal and a second terminal coupled to an anode of the second diode, wherein the second periodic positive voltage signal is substantially out of phase with the first periodic positive voltage signal; and means for connecting the anode of the second diode to an output terminal of the negative voltage source and ensuring that the voltage at the output terminal is about less than the voltage at the anode of the second diode; and the negative voltage charge pump comprises:

a third diode;

means for connecting the anode of the diode to the output terminal of the negative voltage source; and a third capacitor having a first terminal for receiving the first periodic positive voltage signal and a second terminal coupled to an anode of the third diode.

12. The non-volatile memory of claim 1, further comprising:

a positive voltage row decoder; and an isolation circuit connected between the positive voltage row decoder and the array of P-channel transistors.

13. A method for decreasing a threshold voltage of a selected memory cell in a memory array, comprising:

connecting sense lines in the memory array to an array of P-channel transistors, wherein each sense line is coupled to control gates of a row of memory cells in the memory array and to a row of P-channel transistors in the array of P-channel transistors;

applying a negative voltage to the array of P-channel transistors; and applying a set of negative voltage address signals to gates of P-channel transistors in a first row of P-channel transistors in the array of P-channel transistors, wherein the set of negative voltage address signals indicates the selected memory cell and causes the first row of P-channel transistors to apply the negative voltage to a sense line which is coupled to the control gate of the selected memory cell.

14. The method of claim 13, further comprising applying to gates of P-channel transistors in a second row of the array of P-channel transistors a second set of address signals, wherein the second set of address signals prevents the second row of P-channel transistors from applying the negative voltage to a sense line which is coupled to the second row of P-channel transistors.

15. The method of claim 14, further comprising applying a positive voltage to drains of memory cells in a first column of the memory array while applying the negative voltage to the sense line coupled to the control gate of the selected memory cell, wherein the first column of memory cells contains the selected memory cell.

16. The method of claim 15, further comprising allowing drains of memory cells in a second column of the memory array to float while applying the negative voltage to the sense line coupled to the control gate of the selected memory cell.

17. The non-volatile memory of claim 1, wherein the negative voltage source comprises a terminal adapted for connection to an external power supply which provides the first negative voltage.

18. A non-volatile memory comprising:

a memory array containing rows of memory cells, each memory cell having a control gate;

a plurality of sense lines, each sense line being coupled to the control gates of memory cells in a corresponding row of the memory array;

a transistor array coupled the sense lines, the transistor array including rows of P-channel transistors, wherein the P-channel transistors in a row are connected in series; and a negative voltage address signal generator coupled to gates of the P-channel transistors and providing negative gate voltages which cause the transistor array to apply a negative voltage to a selected one of the sense lines.

19. The non-volatile memory of claim 18, wherein the transistor array further comprises individual P-channel transistors, each of which is directly coupled to a corresponding one of the sense lines, and wherein each of the rows of P-channel transistors in the transistor array is coupled to at least one of the individual P-channel transistors.

* * * * *